US012431389B2

(12) United States Patent
Herr et al.

(10) Patent No.: US 12,431,389 B2
(45) Date of Patent: Sep. 30, 2025

(54) SUPERCONDUCTIVE INTERCONNECT STRUCTURE

(71) Applicant: IMEC VZW, Leuven (BE)

(72) Inventors: Anna Yurievna Herr, Leuven (BE); Quentin Paul Herr, Leuven (BE); Zsolt Tokei, Leuven (BE); Anshul Gupta, Leuven (BE)

(73) Assignee: IMEC VZW, Leuven (BE)

( * ) Notice: Subject to any disclaimer, the term of this patent is extended or adjusted under 35 U.S.C. 154(b) by 472 days.

(21) Appl. No.: 17/877,500

(22) Filed: Jul. 29, 2022

(65) Prior Publication Data

US 2024/0038589 A1 Feb. 1, 2024

(51) Int. Cl.
*H01L 21/768* (2006.01)
*H01L 23/522* (2006.01)
*H01L 23/532* (2006.01)

(52) U.S. Cl.
CPC .. *H01L 21/76897* (2013.01); *H01L 21/76885* (2013.01); *H01L 23/5226* (2013.01); *H01L 23/53285* (2013.01)

(58) Field of Classification Search
CPC ......... H01L 21/76897; H01L 21/76885; H01L 23/5226; H01L 23/53285
USPC ....................................................... 257/661
See application file for complete search history.

(56) References Cited

U.S. PATENT DOCUMENTS

| | | | |
|---|---|---|---|
| 9,859,161 B2 | 1/2018 | Boemmels et al. | |
| 10,312,142 B2 * | 6/2019 | Kirby | H01L 21/76877 |
| 10,692,759 B2 | 6/2020 | Jiang et al. | |
| 11,189,523 B2 * | 11/2021 | Shih | H01L 23/3192 |
| 2020/0144476 A1 | 5/2020 | Huang et al. | |

OTHER PUBLICATIONS

Akaike et al., "Fabrication of NbTiN/Al-AlNX/NbTiN Josephson Junctions for Superconducting Circuits Operating Around 10 K", IEEE Transactions on Applied Superconductivity, vol. 26, No. 5, Aug. 13, 2016, 5 pages.
Buijtendorp et al., "Hydrogenated Amorphous Silicon Carbide: A Low-loss Deposited Dielectric for Microwave to Submillimeter Wave Superconducting Circuits," Physical Review Applied, vol. 18, No. 6, as early as Dec. 1, 2022, 6 pages.

(Continued)

*Primary Examiner* — Tu-Tu V Ho
(74) *Attorney, Agent, or Firm* — Workman Nydegger

(57) ABSTRACT

A method for forming a superconducting interconnect structure, comprising: providing a substrate, forming a superconductive layer, forming a layer of a first dielectric material, removing parts of the layer of the first dielectric material and of the superconductive layer so as to form a pattern comprising a first set of line structures comprising: a first set of superconductive line structures, and a first set of line structures made of the first dielectric material, forming a second dielectric material between the line structures of the first set, forming a layer formed of a third dielectric material, providing a patterned mask, transferring the pattern into the first dielectric material and into the layer formed of the third dielectric material, so as to form the at least one via hole, removing the patterned mask, and forming a superconductive material layer so as to form at least one via.

15 Claims, 6 Drawing Sheets

(56) References Cited

OTHER PUBLICATIONS

Grigoras et al., "Superconducting TiN Through-Silicon-Vias For Quantum Technology," 2019 IEEE 21st Electronics Packaging Technology Conference (EPTC), Dec. 4-6, 2019, pp. 81-82.
Villégier et al, "Integration of Planarized Internally-Shunted Submicron NbN Junctions," IEEE Transactions on Applied Superconductivity, vol. 21, No. 3, as early as Jun. 1, 2011, pp. 102-106.
Yost et al, "Solid-State Qubits Integrated With Superconducting Through-Silicon Vias," npj Quantum Information, vol. 6 No. 59, Jul. 3, 2020, 7 pages.
International Search Report from corresponding PCT Application No. PCT/EP2023/071066, Oct. 24, 2023.
Murdoch G. et al., "First demonstration of Two Metal Level Semi-damascene Interconnects with Fully Self-aligned Vias at 18MP", 2022 IEEE Symposium on VLSI Technology amd Circuits (VLSI Technology and Circuits), IEEE, Jun. 12, 2022, pp. 1-2.
Murdoch Gayle et al., "Feasibility study of fully self aligned vias for 5nm node BEOL", 2017 IEEE International Interconnect Technology Congerence (IITC), IEEE, May 16, 2017, pp. 1-4.
Pokhrel Ankit et al., "Towards Enabling Two Metal Level Semi-Damascene Interconnects for Superconducting Digital Logic: Fabrication, Characterization and Electrical Measurements of Superconducting $NB_xTi(1-x)N$", 2023 IEEE International Interconnect Technology Conference (IITC) and IEEE Materials for Advanced Metallization Conference (MAM) (IITC/MAM), IEEE, May 22, 2023, pp. 1-3.

\* cited by examiner

SUPERCONDUCTIVE INTERCONNECT
STRUCTURE

TECHNICAL FIELD OF THE INVENTION

The present invention relates to the field of superconductive interconnects for an integrated circuit. In particular, the present invention relates to a method for forming superconductive lines and vias.

BACKGROUND OF THE INVENTION

Superconducting digital technology has a high potential as a beyond-CMOS technology. Advantages relating to superconducting digital technology are a high energy efficiency, a high computational density, and a high interconnect bandwidth. Superconducting digital technology is typically based on the single-flux-quantum (SFQ) pulse that is fast, low power, and low-dispersion/low-loss on superconductor transmission lines.

Superconducting interconnects may connect different devices in an integrated circuit based on superconducting digital technology. In the state of the art, a metal etch is typically performed to form these superconducting interconnects. However, although metal etch is suitable to be used for many superconducting materials, the possibility for downsizing interconnect structures may be limited. For example, conventional Nb wires have high sensitivity to parasitic and magnetic coupling, require multiple ground planes and special place and route algorithms. High kinetic inductance wires, on the other hand, have low sensitivity to parasitic magnetic coupling, allow for high density routing provided that tight control of material parameter spread can be ensured throughout the fabrication method.

There is, thus, a need for techniques for further downsizing superconducting interconnect structures. However, for good superconducting logic and memory, a back-end-of-line process is preferred that is compatible with a high-kinetic inductance material (e.g., NbTiN), that enables forming several layers of superconductive line structures with a pitch down to 100 nm or below, and that allows for forming vias that match the superconductive line structures pitch. At the same time, a tight cross-section control (the cross-section determining the inductance per unit length) of the superconductive line structures and vias is preferred.

There is thus still a need in the art for devices and methods that address at least some of the above problems.

SUMMARY OF THE INVENTION

It is an object of the present invention to provide a good method for forming a superconducting interconnect structure of an integrated circuit, and a good superconducting interconnect structure obtainable thereby.

The above objective is accomplished by a method and a structure according to the present invention.

It is an advantage of embodiments of the present invention that downsizing of superconducting interconnect structures may be enabled. It is, indeed, an advantage of embodiments of the present invention that the pitch between superconductive line structures of a first entity and superconductive line structures of a second entity overlying the first entity may be small, e.g., as small as 100 nm or even below.

It is an advantage of embodiments of the present invention that the superconducting interconnect structure may have superconductive line structures and vias for which the cross-section may be tightly controlled. It is a further advantage of embodiments of the present invention that the vias may have a small parasitic inductance. It is still a further advantage of embodiments of the present invention that a high fill ratio may be achieved for the superconductive line structures.

It is an advantage of embodiments of the present invention that shallow vias (that is, having a low aspect ratio) may be formed.

It is an advantage of embodiments of the present invention that the method is compatible with high-kinetic inductance materials (e.g., NbTiN), for which deposition in trenches may be difficult.

A method for forming a superconducting interconnect structure of an integrated circuit, comprising:
 a. forming a first entity on a substrate by:
  a1. providing a substrate,
  a2. forming a first superconductive layer of a first superconductive material having a first critical temperature on the substrate,
  a3. forming a layer of a first dielectric material over the first superconductive layer,
  a3'. optionally forming a protective dielectric layer, e.g., having a thickness of from 1 to 20 nm, e.g., 5 to 15 nm, such as 10 nm, on top of the first dielectric material,
  a4. removing parts of the layer of the first dielectric material and of the first superconductive layer, said parts extending from a bottom surface of the first superconductive layer to a top surface of the first dielectric material, so as to form a pattern comprising a first set of line structures having a top surface, comprising:
   a first set of superconductive line structures, and
   a first set of line structures made of the first dielectric material, aligned with and overlying the first set of superconductive line structures, and comprising the top surface,
  a5. forming a second dielectric material, different from the first dielectric material, over and between the line structures of the first set,
  a6. planarizing the second dielectric material so that a top surface of the second dielectric material is coplanar with the top surface of the first set of line structures, and thereafter
  a7. forming a layer formed of a third dielectric material over the first set of line structures and the second dielectric material,
  thereby forming the first entity,
 b. providing a patterned mask over the first entity, the pattern comprising at least one opening overlapping with an underlying superconductive line structure of the first set of superconductive line structures for forming at least one via hole in the first dielectric material and the layer formed of the third dielectric material,
 c. transferring the pattern of the patterned mask into the first dielectric material and into the layer formed of the third dielectric material, so as to form the at least one via hole extending through the first dielectric material and the layer formed of the third dielectric material, thereby exposing part of the underlying superconductive line structure,
 d. removing the patterned mask, thereby exposing a perforated surface, and
 e. forming a superconductive unit made of one or more superconductive materials, each having a critical temperature within 1K of the first critical temperature, over the perforated surface thereby also forming at least one via by filling the at least one via hole, the at least one via extending through the first dielectric material and the layer formed of the third dielectric material, such that the formed superconductive unit physically contacts the underlying first set of superconductive line structures.

In a second aspect, the present invention relates to a superconducting interconnect structure formable by a method according to any embodiment of the first aspect, the interconnect structure comprising a first entity comprising:

a first set of line structures having a top surface, comprising:

a first set of superconductive line structures, a first set of lines structures made of a first dielectric material, aligned with and overlying the first set of superconductive line structures, and comprising the top surface, and ii. a second dielectric material, different from the first dielectric material, between the line structures of the first set having a top surface coplanar with the top surface of the first set of line structures, and iii. a third dielectric material overlying the first set of line structures and the second dielectric material, and wherein a via extends through the first dielectric material and the layer formed of the third dielectric material, wherein the via comprises a superconducting material physically contacting the underlying superconductive line structure.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

Figure 1:
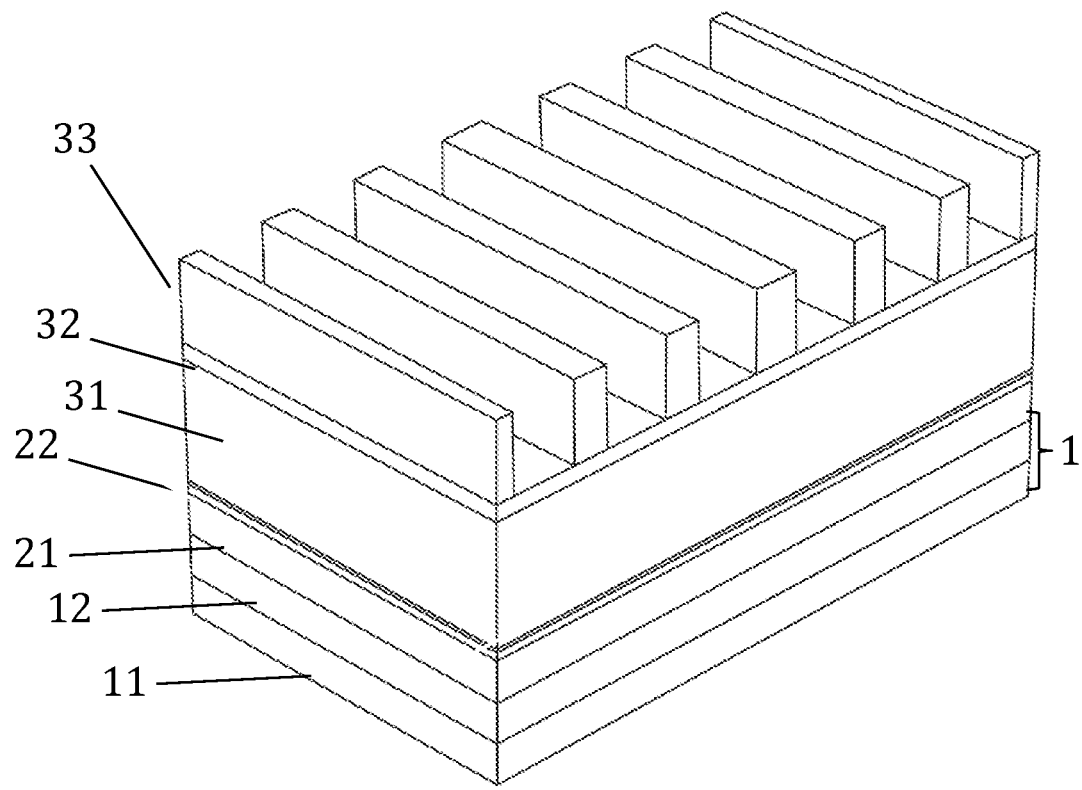
FIG. 1-11 are schematic representations of a perspective view of different steps in a method for forming a superconducting interconnect structure in accordance with embodiments of the present invention.

In the different figures, the same reference signs refer to the same or analogous elements.

DESCRIPTION OF ILLUSTRATIVE EMBODIMENTS

The present invention will be described with respect to particular embodiments and with reference to certain drawings, but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

The terms "over", "overlying", and "above" are used as synonyms and cover situations with and without physical contacts. The term "on" means "over and in physical contact with".

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. The word "comprising" according to the invention therefore also includes as one embodiment that no further components are present. Thus, the scope of the expression "a device comprising means A and B" should not be interpreted as being limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

The following terms are provided solely to aid in the understanding of the invention.

As used herein and unless provided otherwise, when an entity is described as being superconductive, it means that this entity has the ability to become superconductive at a temperature below a certain critical temperature. It does not mean that the entity is superconductive at the time it is formed during the method. On the contrary, the steps of the method are typically performed at temperatures higher than the critical temperature of the superconductive materials involves. Hence, for instance, forming a first superconductive layer does not result in a layer which is superconductive as soon as it has been formed but results in a layer that can become superconductive after the temperature of the layer has been decreased below its critical temperature.

In a first aspect, the present invention relates to a method for forming a superconducting interconnect structure of an integrated circuit, comprising:
  a. forming a first entity (44) on a substrate (1) by:
    a1. providing a substrate (1),
    a2. forming a first superconductive layer (21) of a first superconductive material having a first critical temperature on the substrate (1),
    a3. forming a layer of a first dielectric material (22) over the first superconductive layer (21),
    a3'. optionally forming a protective dielectric layer, e.g., having a thickness of from 1 to 20 nm, e.g., 5 to 15 nm, such as 10 nm, on top of the first dielectric material (22),
    a4. removing parts of the layer of the first dielectric material (22) and of the first superconductive layer (21), said parts extending from a bottom surface of the first superconductive layer (21) to a top surface of the first dielectric material (22), so as to form a pattern comprising a first set of line structures (4) having a top surface (420), comprising:
      a first set of superconductive line structures (41), and
      a first set of line structures made of the first dielectric material (42), aligned with and overlying the first set of superconductive line structures (41), and comprising the top surface (420),
    a5. forming a second dielectric material (50), different from the first dielectric material, over and between the line structures of the first set (4),
    a6. planarizing the second dielectric material (50) so that a top surface of the second dielectric material (51) is coplanar with the top surface (420) of the first set of line structures (4), and thereafter
    a7. forming a layer formed of a third dielectric material (6) over the first set of line structures (4) and the second dielectric material (50),
    thereby forming the first entity (44),
  b. providing a patterned mask (73) over the first entity, the pattern comprising at least one opening (730) overlapping with an underlying superconductive line structure of the first set of superconductive line structures (41) for forming at least one via hole (43) in the first dielectric material (42) and the layer formed of the third dielectric material (6),
  c. transferring the pattern of the patterned mask (73) into the first dielectric material (42) and into the layer formed of the third dielectric material (6), so as to form the at least one via hole (43) extending through the first dielectric material (42) and the layer formed of the third dielectric material (6), thereby exposing part of the underlying superconductive line structure (41),
  d. removing the patterned mask (73), thereby exposing a perforated surface (60), and
  e. forming a superconductive unit (81, 201, 8) made of one or more superconductive materials, each having a critical temperature within 1K of the first critical temperature, over the perforated surface (60) thereby also forming at least one via (81) by filling the at least one via hole (43), the at least one via (81) extending through the first dielectric material (42) and the layer formed of the third dielectric material (6), such that the formed superconductive unit (81, 201, 8) physically contacts the underlying first set of superconductive line structures (41).

The inventors have found that several superconducting materials that are preferred for practical applications, may be particularly difficult to deposit in via holes or trenches having a high aspect ratio. Herein, the aspect ratio is a ratio of a height (e.g., of the via, via hole, wire, or trench), in a direction normal to a top surface of the superconductive line structures, to a width (e.g., of the via, via hole, wire, or trench), in a direction parallel to the top surface of the superconductive line structures. As such, the superconductive line structures, which are preferably as narrow as possible so that a high density of interconnects in the superconducting interconnect structure may be obtained, may be difficult to form using a damascene-type process. At the same time, vias are preferably shallow, i.e., preferably have a small aspect ratio, so that a high density of interconnects in the superconducting interconnect structure may be achieved. The inventors have found that good downscaling of superconducting interconnect structures may be achieved by combining a metal etch-type process for forming the superconductive line structures, with a damascene-type process for forming the vias.

In embodiments, the method of the present invention is for forming a superconducting interconnect structure in the back end of line stage of the fabrication of an integrated circuit.

The nature of the substrate is not crucial. The substrate typically comprises a semiconductor wafer having or not having a dielectric layer thereover. For instance, it can comprise a bare silicon wafer or a silicon wafer having a silicon oxide layer thereon.

In some embodiments, the substrate may comprise individual isolated devices. The top surface of the substrate may comprise a dielectric surface comprising conductive or superconductive islands for establishing a connection to said individual isolated devices. In the method of the present invention, the first set of semiconductive line structures formed during step a. may form physical contacts with one or more of these islands. These physical contacts can become electrical contacts when the temperature of the semiconductive line structures is decreased below the critical temperature.

The substrate may also comprise pre-existing vias connected to pre-existing superconductive line structures. The top surface of the substrate may comprise a dielectric surface comprising conductive or superconductive via top surfaces. In the method of the present invention, the first set of semiconductive line structures formed during step a. may form physical contacts with one or more of these pre-existing vias.

The method of the present invention is compatible for the formation of superconductive interconnects in most type of superconductive material. For instance, the first, second, and third superconductive materials can be independently selected from superconductive chemical elements (e.g., Al, Ti, Nb, . . . ), and superconductive compounds (e.g., MoN, $Nb_3Sn$, NbTi, NbTiN and NbN). Preferred superconductive materials comprise Nb, more preferred superconductive materials comprise Nb and at least one of Ti and N, and most preferred comprise Nb, Ti, and N (e.g. NbTiN). In these last compounds, the atomic ratio N/(Nb+Ti) is preferably equal to 0.5, and the atomic ratio Nb/(Nb+Ti) is preferably typically from 0.65 to 0.84. These last compounds have particularly high critical temperatures. Preferably, the critical temperature of the first superconductive material is 10K or more. More preferably, it is 12K or more. Yet more preferably, it is 14K or more. Even more preferably, it is 16K or more. For instance, it can be from 16.5K to 17.5K.

In embodiments, each superconductive layer used in the method may have a thickness independently selected within the range of from 20 to 500 nm, preferably 30 to 350 nm, more preferably from 50 to 200 nm.

In preferred embodiments, step a2. is performed by physical vapor deposition. Although, instead, atomic layer deposition or chemical vapor deposition could be used, the present invention enables the use of physical vapor deposition, which is a technique that may be easily implemented. The inventors have also found that, when used in the present invention, good control of the dimensions of the vias and the superconductive line structures may be achieved with physical vapor deposition.

When step a3' is performed, step a4. Consists in removing parts of the protective dielectric layer, of the layer of the first dielectric material (22), and of the first superconductive layer (21), said parts extending from a bottom surface of the first superconductive layer (21) to a top surface of the protective dielectric layer, so as to form a pattern comprising a first set of line structures (4), comprising:
  a. a first set of superconductive line structures (41),
  b. a first set of line structures made of the first dielectric material (42), aligned with and overlying the first set of superconductive line structures (41), and comprising a top surface (420),
  c. a first set of protective dielectric line structures, aligned with and overlying the first set of line structures made of the first dielectric material (42).

In embodiments, step a4. of removing parts of the layer of the first dielectric material and of the first superconductive layer may be performed by first forming a hard mask (e.g., a layer or stack of layers) over the layer of the first dielectric material, followed by forming a photoresist patterned mask on the hard mask, followed by etching through the hard mask by using the photoresist patterned mask as a mask, thereby transferring the pattern of the photoresist patterned mask into the hard mask, followed by etching through the first dielectric layer and through the superconductive layer by using the hard mask as a mask.

In embodiments, the line structures of the first set of line structures have a rectangular cuboid shape. In embodiments, the line structures of the first set of superconductive line structures have a rectangular cuboid shape. In embodiments, a height of the superconductive line structures, in a direction normal to a top surface of the superconductive line structures, is from 20 to 500 nm, preferably from 30 to 350 nm, more preferably from 50 to 200 nm. In embodiments, a width of the superconductive line structures, in a direction parallel to a top surface of the superconductive line structures, is from 20 to 500 nm, preferably from 30 to 350 nm, more preferably from 50 to 200 nm. In embodiments, a length of the superconductive line structures, in a direction parallel to a top surface of the superconductive line structures and perpendicular to the width, is at least 200 nm, preferably at least 500 nm. Herein, the length is longer than the width. In embodiments, the aspect ratio of the line structures, i.e., the ratio between their height and their width, is from 1 to 4.

In embodiments, the sidewalls of a superconductive line structure form an angle with a top surface of the substrate which is from 85° to 93°, preferably from 88° to 92°, more preferably from 89° to 90° C. Typically, this angle is 90°.

In embodiments, the line structures of the first set of line structures made of the first dielectric material have a rectangular cuboid shape. In embodiments, a height of the line structures made of the first dielectric material, in a direction normal to a top surface of the line structures made of the first dielectric material, is from 1 to 50 nm, preferably from 5 to 20 nm. In embodiments, a width of the line structures made of the first dielectric material, in a direction parallel to a top surface of the line structures made of the first dielectric material, is from 20 to 500 nm, preferably from 30 to 350 nm, more preferably from 50 to 200 nm. In embodiments, a length of the line structures made of the first dielectric material, in a direction parallel to a top surface of the line structures made of the first dielectric material and perpendicular to the width, is at least 200 nm, preferably at least 500 nm. Herein, the length is longer than the width. In embodiments, the width of the line structures made of the first dielectric material is within 2% of, e.g., within 1% of, such as the same as, the width of the superconductive line structures. In embodiments, the length of the line structures made of the first dielectric material is within 2% of, e.g., within 1% of, such as the same as, the length of the superconductive line structures.

In embodiments, the protective dielectric line structures of the first set may have a rectangular cuboid shape. In embodiments, a height of the protective dielectric line structures, in a direction normal to a top surface of the line structures made of the first dielectric material, may be from 1 to 50 nm. In embodiments, a width of the protective dielectric line structures, in a direction parallel to a top surface of the line structures made of the first dielectric material, is from 20 to 500 nm, preferably 30 to 350, more preferably from 50 to 200 nm. In embodiments, a length of the protective dielectric line structures, in a direction parallel to a top surface of the line structures made of the first dielectric material and perpendicular to the width, is at least 200 nm, preferably at least 500 nm. Herein, the length is longer than the width. In embodiments, the width of protective dielectric line structures is within 2% of, e.g., within 1% of, such as the same as, the width of the superconductive line structures. In embodiments, the length of the protective dielectric line structures is within 2% of, e.g., within 1% of, such as the same as, the length of the superconductive line structures.

In embodiments, the line structures of the first set are parallel to one another. In embodiments, the line structures of the first set all have the same width, the same length, and the same height.

In embodiments, the line structures of the first set may be at a pitch of from 30 to 500 nm, e.g., from 100 to 400 nm.

In embodiments, the first dielectric material may be selected from silicon nitride and silicon carbonitride while the second dielectric material may be selected from silicon oxide and high-k oxides such as aluminum oxide and hafnium oxide. In embodiments, the first dielectric material is silicon nitride and the second dielectric material is silicon oxide. Typically, the second dielectric material is the same as the material of the protective dielectric layer. In embodiments, the first dielectric material is silicon nitride, the second dielectric material is silicon oxide, and the protective dielectric is silicon oxide. It is an advantage of these embodiments that silicon nitride may be selectively etched with respect to silicon oxide.

When the protective dielectric line structures are present, step a6 stops when the protective dielectric line structures have been removed.

In embodiments, the layer formed of the third dielectric material preferably has a thickness of from 1 to 50 nm, such as from 2 to 30 nm.

Preferably, the third dielectric material is an oxide. For instance, it may be selected from silicon oxide and high-k oxides such as hafnium oxide and aluminum oxide. For instance, it may comprise, e.g., consist of, silicon dioxide.

Typically, the patterned mask provided in step b. comprises a photoresist mask.

In embodiments, the method further comprises, after step a7., and before step b., a step a7'.: forming a hard mask layer over (e.g., on) the first set of line structures, the second dielectric material, and the third dielectric material, wherein, in step b., the patterned mask is provided over (e.g., on) the hard mask layer, wherein, in a step b1., after step b. and before step c., the pattern of the patterned mask is transferred into the hard mask layer, wherein, in step c., transferring the pattern of the patterned mask into the first dielectric material and into the layer formed of the third dielectric material, comprises transferring said pattern from the patterned hard mask layer into the layer formed of the third dielectric material and into the first dielectric material, and wherein step d. further comprises removing the patterned hard mask layer. In these embodiments, the perforated surface is only exposed after removal of both the patterned mask and the patterned hard mask layer. Said removing of the patterned mask of step d. may be performed after step b1. and before step c. Said removing of the patterned hard mask layer of step d. may be performed after step c and before step e. Preferably, said transferring of the pattern of the patterned mask into the hard mask layer is performed by selectively etching the hard mask layer with respect to the third dielectric material by using the patterned mask as a mask. It is an advantage of these embodiments that the third dielectric material may function as an etch stop layer.

Any hardmask layer/multilayer is suitable as long as it can be removed selectively with respect to the protective dielectric layer if present or with respect to the first dielectric material when the protective dielectric layer is not present.

In some embodiments, the hardmask may comprise one or more layers selected from amorphous carbon, spin-on-carbon (SOC), spin-on-glass (SOG), and spin-on-carbon (SiOC).

In some embodiments, the hardmask can be a thick (15-30 nm) silicon oxide layer replacing the (typically thinner) protective dielectric layer.

In embodiments, in step c., said transferring comprises etching the first dielectric material selectively with respect to the second dielectric material. It is an advantage of these embodiments that self-alignment of the via hole on the underlying superconductive line structures may be achieved.

In embodiments, the perforated surface is the top surface of the third dielectric material as obtained after step d.

In embodiments, step e. may consist of depositing a second superconductive layer made of a single superconductive material having a critical temperature within 1K of the first critical temperature over the perforated surface so as to fill the at least one via hole extending through the first dielectric material and the layer formed of the third dielectric material and such that the deposited second superconductive layer electrically contacts the underlying first set of superconductive line structures, and wherein step f. is performed directly after step e. These embodiments are particularly advantageous when the density of via holes is below 5%. This density is calculated with reference to the total top surface composed of the top surface of the second dielectric material and the top surface of the first set of line structures which is coplanar therewith. In other words, it is the portion of the total top surface which is occupied by the via holes. It is calculated by dividing the top surface occupied by the via holes by the total top surface coplanar therewith. These embodiments are also particularly advantageous when subsequent entities (see infra), and hence further vias and further sets of superconductive line structures, are not provided. Indeed, as the number of non-planar layers increases in these embodiments, the non-planarity increases to an unacceptable degree.

It is an advantage of these embodiments that the superconductive material layer deposited in step e. for forming the at least one via may be used for forming the second set of superconductive line structures, thereby economizing superconductive material and reducing the number of steps.

Preferably, the first superconducting layer and the second superconducting layer are made of the same material.

In different embodiments, step e. comprises: e1. Forming a first part of the superconductive unit by depositing a second superconductive layer, made of a single superconductive material having a critical temperatures within 1K of the first critical temperature, over the perforated surface so as to form at least one via by filling the at least one via hole, the at least one via extending through the first dielectric material, and extending through the layer formed of the third dielectric material, such that the formed second superconductive layer electrically contacts the underlying first set of superconductive line structures, e2. planarizing the deposited second superconductive layer so as to remove a top portion of the second superconductive layer without removing the at least one via, and e3. Forming a second part of the superconductive unit by depositing a third superconductive layer made of a single superconductive material having a critical temperature within 1K of the first critical temperature, on the planarized second superconductive layer.

In embodiments, the removed top portion is such that the top surface of the third dielectric layer is exposed. In such embodiments, all the superconductive unit but the vias is removed.

In other embodiments, the removed top portion is such that the third dielectric layer remains covered by a bottom portion of the second superconductive layer. In such embodiments, the thickness of the top portion is at least equal to the depth of the concavities.

Typically, the top surface of the superconductive unit formed in step e. may comprise concavities above the vias, so that the top surface of the superconductive unit may not be flat. This may be a problem, for example when a plurality of alternating superconductive line structures and vias are formed stacked on each other, for example, as concavities overlying each other may reinforce each other. Therefore, preferably, the superconductive unit has a flat top surface. By first planarizing the deposited second superconductive layer, then depositing a third superconductive layer on the planarized superconductive material layer, the resulting superconductive unit does not comprise these concavities.

In embodiments, step e2. comprises using chemical mechanical polishing and/or etching. In embodiments, said chemical mechanical polishing is performed selectively on the superconductive material with respect to the third dielectric material. As a result, all superconductive material extending above the third dielectric material may be removed, so that a top surface of the at least one via and a top surface of the third dielectric material may be coplanar.

In embodiments, the materials forming the first set of superconductive line structures and the superconductive unit are independently selected from MoN, $Nb_3Sn$, NbTi, Nb, NbTiN and NbN. Preferably, the materials forming the first set of superconductive line structures and the superconductive unit are the same. The inventors have found that, although these materials have good superconducting properties, these materials may be particularly difficult to deposit in via holes or trenches having a high aspect ratio.

In embodiments, step e. of forming the superconductive unit may be performed by physical vapor deposition.

Preferably, the first, the second, and the third superconducting layers are made of the same material.

In embodiments, the at least one via hole (and the at least one via) in the first dielectric material and in the layer formed of the third dielectric material, has an aspect ratio of at most 0.5 wherein the aspect ratio is a ratio of a height of the via hole (and of the via), in a direction normal to a top surface of the superconductive line structures, to a width of the via hole (or via), in a direction parallel to the top surface of the superconductive line structures. In embodiment, the via hole (or via) may have an aspect ratio of from 0.1 to 0.5, such as from 0.10 to 0.40, more preferably from 0.15 to 0.35, yet more preferably from 0.20 to 0.30. In embodiments, the height of the via hole (or via) is from 1 nm to 100 nm, preferably from 5 nm to 50 nm, more preferably from 10 nm to 25 nm. In embodiments, the width of the via hole (or via) is from 2 nm to 200 nm, preferably from 20 nm to 100 nm, more preferably from 30 nm to 70 nm. In embodiments, the length of the via hole (or via), in a direction parallel to the top surface of the superconductive line structures and perpendicular to the width, is from 5 nm to 200 nm, preferably from 10 nm to 100 nm, more preferably from 30 nm to 70 nm. In embodiments, the length of the via hole (or via) is from 0.5 to 2 times, preferably from 0.9 to 1.1 times, the width of the via hole (or via).

In embodiments, the method comprises, after step e., providing a second entity over the superconductive unit, comprising the steps of: f. forming a layer of a fourth dielectric material over the superconductive unit, g. removing parts of the layer of the fourth dielectric material and of the superconductive unit so as to form a pattern comprising a second set of line structures, comprising: a second set of superconductive line structures, and a second set of line structures made of the fourth dielectric material, aligned with and overlying the first set of superconductive line structures, thereby providing the second entity over the first entity.

In embodiments, the fourth dielectric material may be the same as the first dielectric material.

The second set of superconductive line structures is at a non-zero angle with the first set of superconductive line structures. Preferably, it is at an angle of 80° to 100°, preferably 90° with the first set.

The dimensions of the lines of the first set of superconductive line structures may be the same or may be different from the dimensions of the lines of the second set of superconductive line structures. The dimensions of the lines of the second set of superconductive line structures may be as defined for the lines of the first set of superconductive line structures.

In embodiments, the line structures of the second set of line structures have a rectangular cuboid shape. In embodiments, the line structures of the second set of superconductive line structures have a rectangular cuboid shape. In embodiments, a height of the superconductive line structures, in a direction normal to a top surface of the superconductive line structures, is from 20 to 500 nm, preferably 30 to 350 nm, more preferably from 50 to 200 nm. In embodiments, a width of the superconductive line structures, in a direction parallel to a top surface of the superconductive line structures, is from 20 to 500 nm, preferably 30 to 350 nm, more preferably from 50 to 200 nm. In embodiments, a length of the superconductive line structures, in a direction parallel to a top surface of the superconductive line structures and perpendicular to the width, is at least 200 nm, preferably at least 500 nm. Herein, the length is longer than the width. In embodiments, the aspect ratio of the line structures, i.e., the ratio between their height and their width, is from 1 to 4.

In embodiments, the sidewalls of a superconductive line structure form an angle with a top surface of the substrate which is from 85° to 93°, preferably from 88° to 90°, more preferably from 89° to 90°. Typically, this angle is 90°.

In embodiments, the line structures of the second set are parallel to one another. In embodiments, the line structures of the second set all have the same width, the same length, and the same height.

In embodiments, the line structures of the second set may be at a pitch of from 30 to 500 nm, e.g., 100 to 400 nm. The pitch of the superconductive line structures of the second set may be the same or may be different from the pitch of the superconductive line structures of the first set.

In embodiments, step g. of removing parts of the layer of the fourth dielectric material and of the superconductive unit may be performed by first forming a hard mask (e.g., a layer or stack of layers) over the layer of the fourth dielectric material, followed by forming a photoresist patterned mask on the hard mask, followed by etching through the hard mask by using the photoresist patterned mask as a mask, thereby transferring the pattern of the photoresist patterned mask into the hard mask, followed by etching through the fourth dielectric layer and through the superconductive unit by using the hard mask as a mask.

In embodiments, subsequent entities can be provided after step g by repeating steps b. to g., thereby forming further vias and further sets of superconductive line structures. Subsequent sets of superconductive line structures are at a non-zero angle with one another. Preferably, subsequent sets of superconductive line structures are at an angle of 80° to 100°, preferably 90° with one another.

In embodiments, the method comprises the following steps after step a. and before step b., or after step e. and before step f., when present: h. providing a third patterned mask over the first entity, the pattern comprising at least one further opening overlapping with an underlying superconductive line structure of the first set of superconductive line structures for forming at least one further via hole in the first dielectric material and the layer formed of the third dielectric material, i. transferring the pattern of the third patterned mask into the first dielectric material and the layer formed of the third dielectric material, so as to form at least one further via hole extending through the first dielectric material and the layer formed of the third dielectric material exposing at least part of the underlying superconductive line structure, j. removing the third patterned mask so as to expose a second perforated surface, and k. depositing a resistive material over the second perforated surface, the resistive material having a resistivity of at least 100 $\mu\Omega$·cm at a temperature of 1K, so as to fill the at least one further via hole extending through the first dielectric material and the layer formed of the third dielectric material and such that the deposited resistive material contacts the underlying superconductive line structure. In some embodiments, the resistor may have no critical temperature or a critical temperature below 1K. It is an advantage of embodiments of the present invention that a superconducting interconnect structure may be formed comprising a resistor, wherein the resistor may connect a superconductive line structure of the first set of superconductive line structures with a superconductive line structure of a second set of superconductive line structures, when present. In embodiments, said resistive material consists of the same chemical elements as the superconductive line structures of the first set, wherein a chemical composition of the resistive material is different from a chemical composition of the superconductive line structures of the first set. In other words, the resistive material consists of the same chemical elements as the superconductive line structures, but a relative amount of the chemical elements differs between the resistive material and the superconductive line structures of the first set. By changing the relative amount of the different chemical elements, a critical temperature of the material may be tuned so that the resistive material has a resistivity of at least 100 $\mu\Omega$·cm at a temperature of 1K. It is an advantage of these embodiments that similar deposition material and techniques may be used for forming the superconducting vias as for forming the resistors.

Most preferably, all superconductive layers or units, as well as all resistors formed during the method are formed by physical vapor deposition (e.g., by DC magnetron sputtering).

Any features of any embodiment of the first aspect may be independently as correspondingly described for any embodiment of the second aspect of the present invention.

In a second aspect, the present invention relates to a superconducting interconnect structure formable by a method according to any of the previous claims, the interconnect structure comprising a first entity (44) comprising:

a first set of line structures (4) having a top surface (420), comprising:
a first set of superconductive line structures (41),
a first set of lines structures made of a first dielectric material (42), aligned with and overlying the first set of superconductive line structures (41), and comprising the top surface (420), and
ii. a second dielectric material (50), different from the first dielectric material (42), between the line structures of the first set (4) having a top surface (51) coplanar with the top surface of the first set of line structures (4), and
iii. a third dielectric material (6) overlying the first set of line structures (4) and the second dielectric material (50),
and wherein a via (81) extends through the first dielectric material (22) and the layer formed of the third dielectric material (6), wherein the via (81) comprises a superconducting material physically contacting the underlying superconductive line structure (21). Any features of any embodiment of the second aspect may be independently as correspondingly described for any embodiment of the first aspect of the present invention.

Any feature of the second aspect may be as correspondingly described for the first aspect.

For instance, via, the superconductive line structures may be as follow:
the at least one via (81) in the first dielectric material (22) and in the layer formed of the third dielectric material (6), may have an aspect ratio of at most 0.5, such as from 0.10 to 0.40 more preferably from 0.15 to 0.35, yet more preferably from 0.20 to 0.30,
a height of the superconductive line structures, in a direction normal to a top surface of the superconductive line structures, may be from 20 to 500 nm, preferably from 50 to 200 nm,
a width of the superconductive line structures, in a direction parallel to a top surface of the superconductive line structures, may be from 20 to 500 nm, preferably from 50 to 200 nm,
a length of the superconductive line structures, in a direction parallel to a top surface of the superconductive line structures and perpendicular to the width, is at least 200 nm, preferably at least 500 nm,
the aspect ratio of the superconductive line structures, i.e., the ratio between their height and their width, is from 1 to 3, and/or
the sidewalls of a superconductive line structure form an angle with a top surface of the substrate which is from 85° to 93°, preferably from 88° to 90°, more preferably from 89° to 90° Typically, this angle is 90°.

The invention will now be described by a detailed description of several embodiments of the invention. It is clear that other embodiments of the invention can be configured according to the knowledge of persons skilled in the art without departing from the technical teaching of the invention, the invention being limited only by the terms of the appended claims.

Example: Forming a Superconducting Interconnect Structure

Reference is made to FIG. 1. A substrate (1) is provided, which, in this example, comprises a silicon wafer (11) covered by an insulator layer (12), e.g., a silicon oxide layer. A superconductive layer (21), e.g., NbTiN, is formed on the substrate 1, which may be deposited by any technique suitable for depositing superconductive materials. Preferably, physical vapor deposition is used for forming the superconductive layer (21) as this technique is also highly suitable for forming the vias (see below), which may result in simplicity of manufacturing of the superconducting interconnect structure. Next, a layer of a first dielectric material (22), e.g., silicon nitride, is formed over the superconductive layer (21). A thin (1-10 nm, e.g., 5 nm) protective silicon oxide layer (not depicted) may be present on top of the silicon nitride.

A patterning mask (31, 32, 33), in this example comprising an ashable hard mask (31), is formed over the layer of the first dielectric material (22). The ashable hard mask (31) is a hard mask that can be removed by an oxygen plasma. In some instances, complete removal of the hard mask may be accomplished by following the ashing with additional wet or dry etching processes, for example when the ashable hard mask leaves behind any residue that cannot be removed by ashing alone. The patterning mask (31, 32, 33) further comprises a silicon oxycarbide layer (32) covering the ashable hard mask (31). The patterning mask further comprises a patterned photoresist (33) overlying the silicon oxycarbide layer (32). The pattern of the patterned photoresist (33), comprising a set of line structures, is first transferred into the ashable hard mask (31) and into the silicon oxycarbide layer (32), using an etch that selectively etches the ashable hard mask (31) and the silicon oxycarbide layer (32) with respect to the patterned photoresist (33) (not depicted). Subsequently, the patterned photoresist (33) is removed (not depicted). An etch that selectively etches the layer of the first dielectric material (22) and the superconductive layer (21) with respect to the ashable hard mask (31) and the silicon oxycarbide layer (32) is performed so as to transfer the pattern from the ashable hard mask (31) and the silicon oxycarbide layer (32) into the layer of the first dielectric material (22) and the superconductive layer (21) (not depicted). Thereby, parts of the layer of the first dielectric material (22) and of the superconductive layer (21), extending from a bottom surface of the superconductive layer (21) to a top surface of the layer of the first dielectric material (22) are removed (not depicted). Finally, the ashable hard mask (31) and the silicon oxycarbide layer (32) are removed (not depicted).

Figure 2:
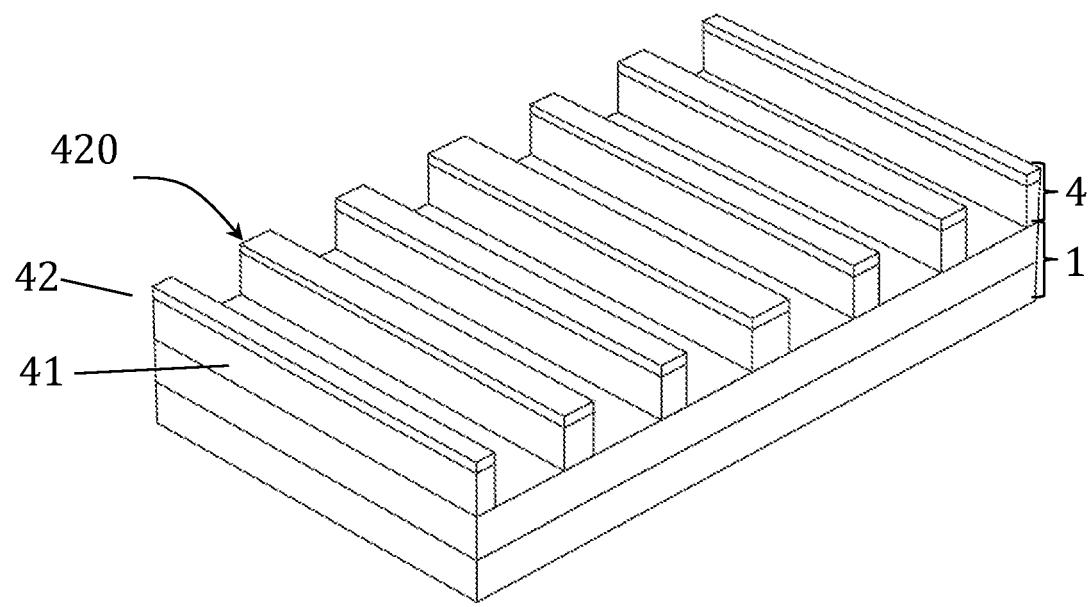

Reference is made to FIG. 2. By transferring the pattern into the first dielectric material and the superconductive layer, a first set of line structures (4) is formed on the substrate (1). The first set of line structures (4) comprises a first set of superconductive line structures (41). Furthermore, the first set of line structures (4) comprises a first set of line structures made of the first dielectric material (42), aligned with and overlying the first set of superconductive line structures (41). The first set of line structures (4) comprises a top surface (420), that is the top surface (420) of the first set of line structures made of the first dielectric material (42).

Figure 3:
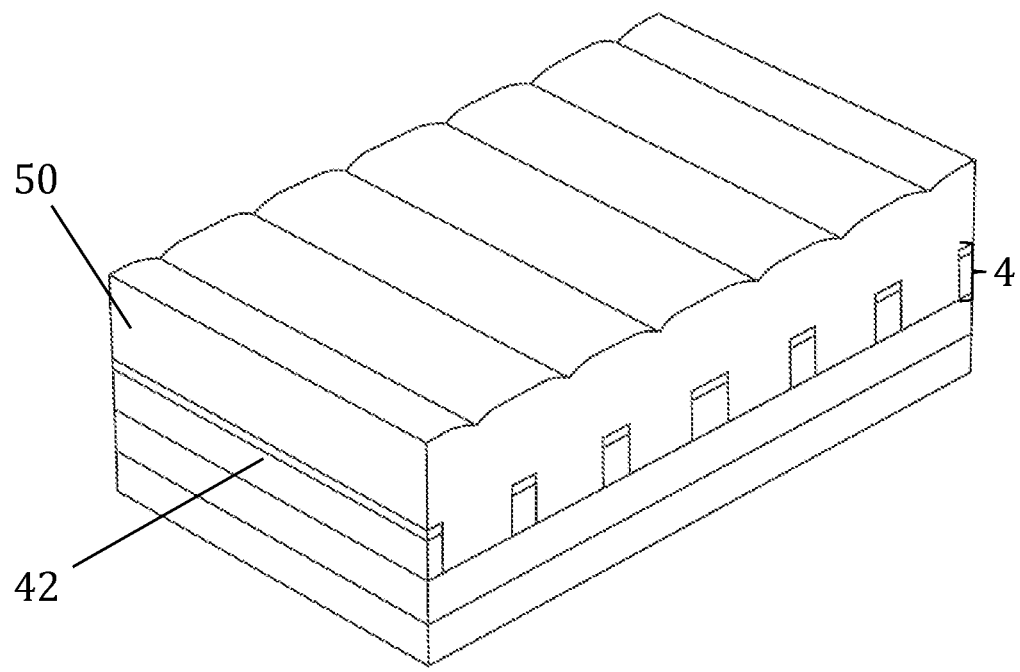

Reference is made to FIG. 3. A second dielectric material (50), different from the first dielectric material is formed over, e.g., on, and between the line structures of the first set (4). The second dielectric material (50) may, for example, be silicon oxide.

Figure 4:
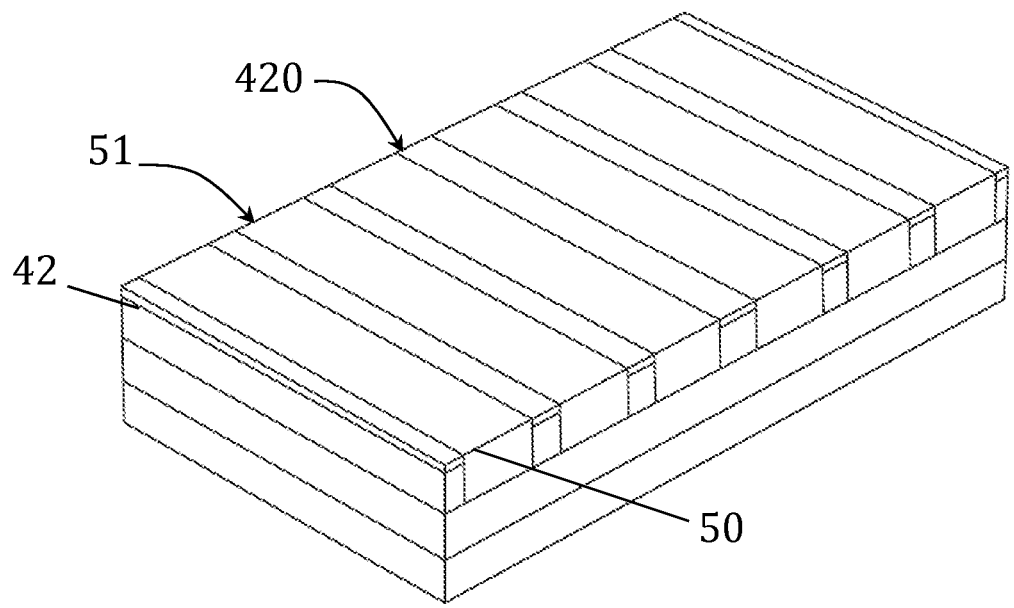

Reference is made to FIG. 4. The second dielectric material (50) is planarized, so that a top surface (51) of the second dielectric material (50) is coplanar with the top surface (420) of the first set of line structures made of the first dielectric material (42). For example, chemical mechanical polishing may be used, wherein said polishing is selective towards the second dielectric material (50) with respect to the first dielectric material (42).

Figure 5:
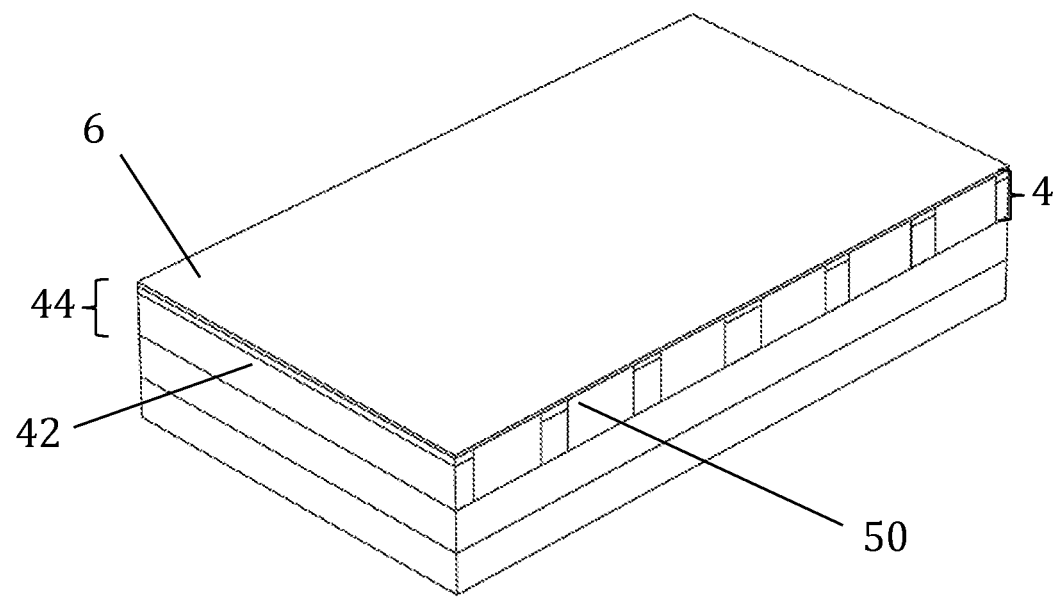

Reference is made to FIG. 5. A layer formed of a third dielectric material (6) is formed over the first set of line structures (4), in this example, on the top surface of the first set of line structures made of the first dielectric material (42), and over, e.g., on, the second dielectric material (50). Thereby, a first entity is formed, comprising the first set of line structures (4), the second dielectric material (50) between the line structures of the first set (4), and the layer formed of the third dielectric material (6).

Figure 6:
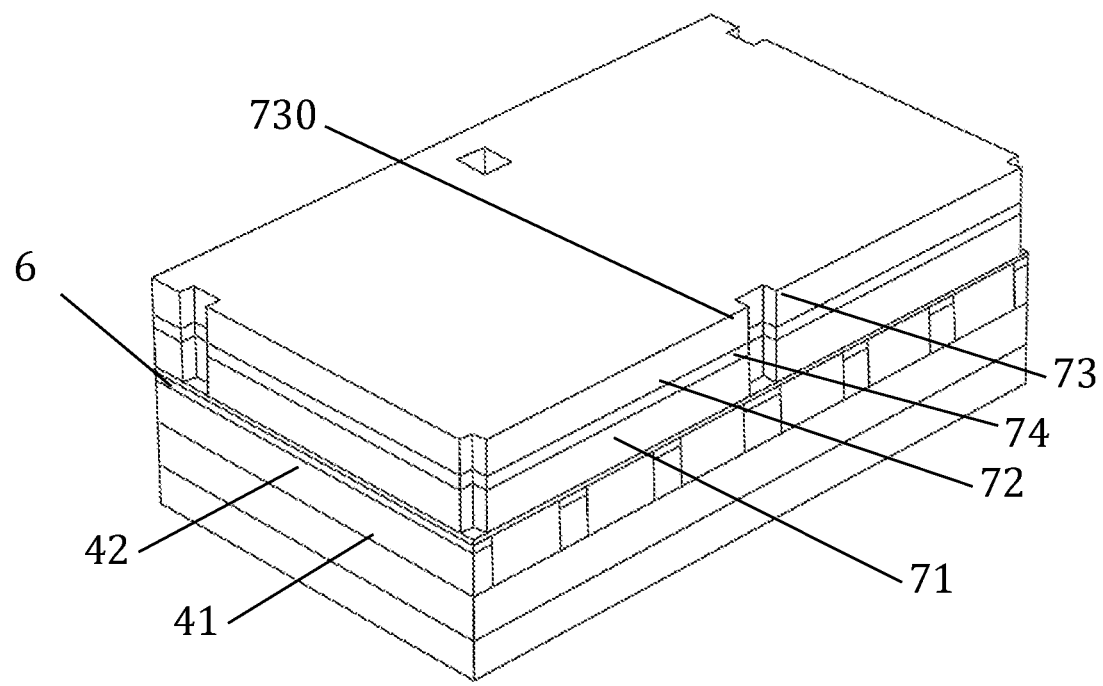

Reference is made to FIG. 6. For forming vias in the layer formed of the third dielectric material (6) and in the first set of line structures made of the first dielectric material (42), first, a spin-on-carbon layer (71) is deposited over, e.g., on, the layer formed of the third dielectric material (6). Next, a spin-on-glass layer (72) is formed over, e.g., on, the spin-on-carbon layer (71). Although this example describes, specifically, spin-on-carbon and spin-on-glass, also different masks, e.g., hard masks, could be used. A mask is used that is selectively etchable with respect to the third dielectric material (6), so that the third dielectric material (6) may function as an etch stop layer. Finally, a photoresist mask is deposited over, e.g., on, the spin-on-glass layer (72), which is subsequently patterned to form a patterned photoresist mask (73). The patterned photoresist mask (73) comprises at least one opening (730) (in this example six openings) overlapping with an underlying superconductive line structure of the first set of superconductive line structures (41). Each opening (730) is for forming a via hole in the first dielectric material (42) and the third dielectric material (6). The pattern of the patterned photoresist mask (73) is transferred into the spin-on-glass layer (72) and into the spin-on-carbon layer (71). In this example, an etch is used that selectively etches the spin-on-glass layer (72) and the spin-on-carbon layer (71), with respect to the patterned photoresist mask (73), and with respect to the third dielectric material (6). As such, the third dielectric material (6) functions as an etch stop layer, i.e., the etching of the spin-on-glass layer (72) and the spin-on-carbon layer (71) may stop at the third dielectric material (6). In this example, the patterned photoresist mask (73) and the patterned spin-on-glass layer (72) are, subsequently, removed.

Figure 7:
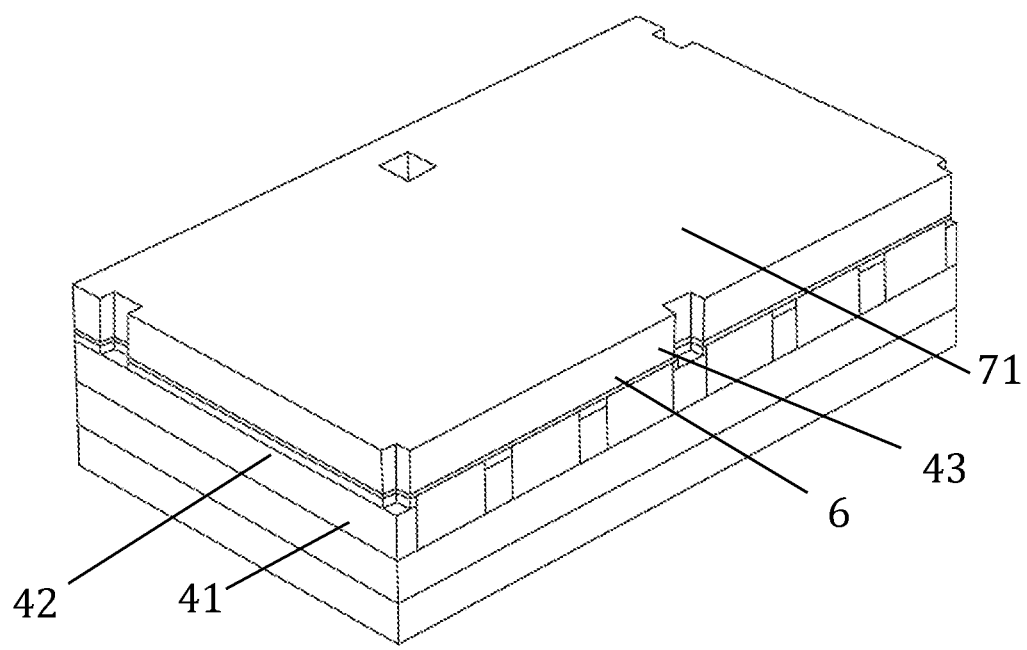

Reference is made to FIG. 7. The pattern of the patterned spin-on-carbon layer (71) over the first entity (44) may be transferred into the layer formed of the third dielectric material (6) and into the first dielectric material (42), so as to form via holes (43) extending through the layer formed of the third dielectric material (6) and through the first dielectric material (42). Thereby, part of the underlying superconductive line structures (41) is exposed. Preferably, an etch is used that selectively etches the first dielectric material (42), e.g., silicon nitride, with respect to the second dielectric material (50), e.g., silicon oxide. Thereby, self-alignment of the via hole (43) on the superconductive line structures (41) may be achieved.

Figure 8:
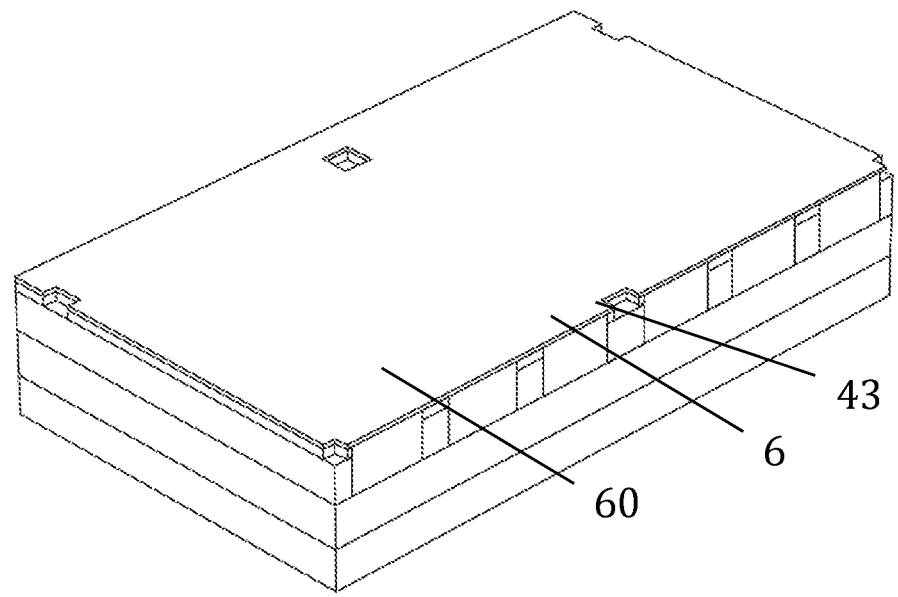

Reference is made to FIG. 8. The patterned spin-on-carbon layer (71) is, in this example, removed selectively with respect to the third dielectric material (6), so that a perforated surface, which is, in this example, the top surface (60) of the third dielectric material (6) perforated by the via holes (43), is exposed.

Figure 9:
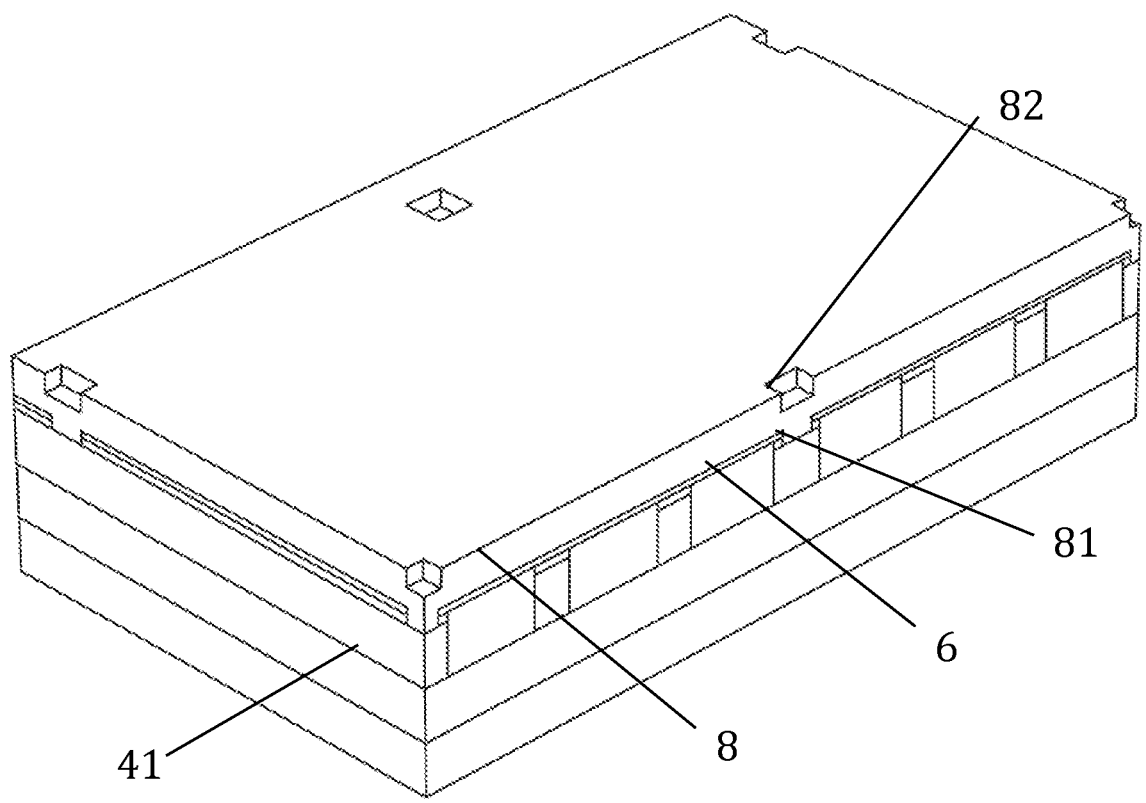

Reference is made to FIG. 9. A superconductive material layer (8) is formed over the perforated surface, in this example, over the top surface of the third dielectric material (6), so as to form a via (81) by filling the at least one via hole. The superconductive material (8) is deposited such that the superconductive material (8) electrically contacts, e.g., physically contact, the exposed underlying superconductive line structures (41).

For superconductive materials (8) such as MoN, Nb$_3$Sn, NbTi, Nb, NbTiN and NbN, the deposition may comprise pits (82), overlying the vias (81) so that it is possible that a non-planar superconductive layer over the perforated surface is formed.

Figure 10:
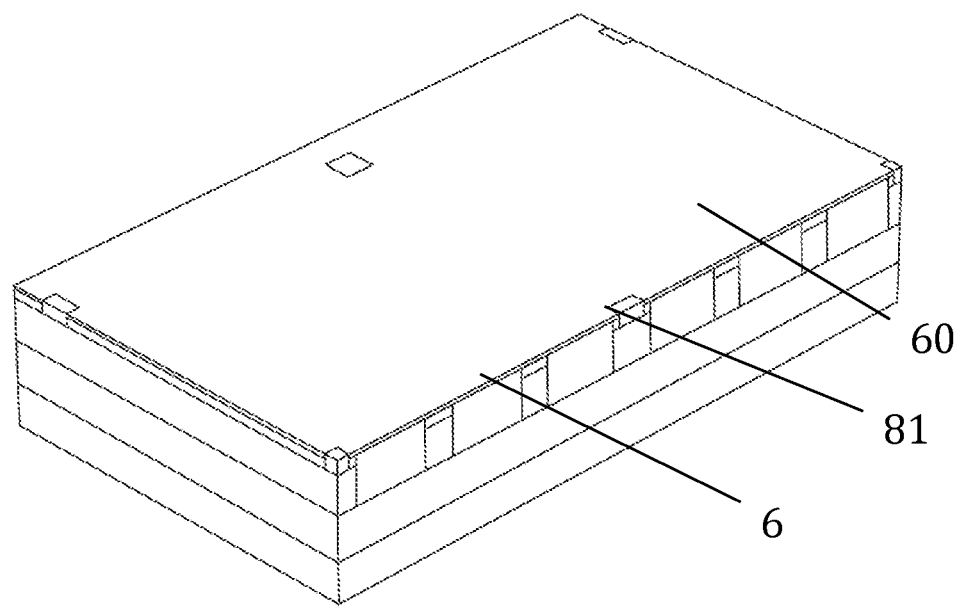

Reference is made to FIG. 10. In order to provide a planar superconductive layer over the perforated surface, the deposited superconductive material layer may be planarized so as to remove a top portion of the superconductive material layer without removing the part of the superconductive material layer filling the at least one via hole, i.e., the via (81). In this example, all deposited superconductive material extending above the perforated surface (60) is removed, so that a top surface of the vias (81) is coplanar with the top surface (60) of the third dielectric material (6). For example, chemical mechanical polishing may be performed that selectively polishes the deposited superconductive material with respect to the third dielectric material (6), so that said polishing may stop at the third dielectric material (6). Alternatively, an etch could be used. Also, the removal of the superconductive material layer may be limited to the top portion of the superconductive material layer. This may result in a planar superconductive material layer over the perforated surface.

Figure 11:
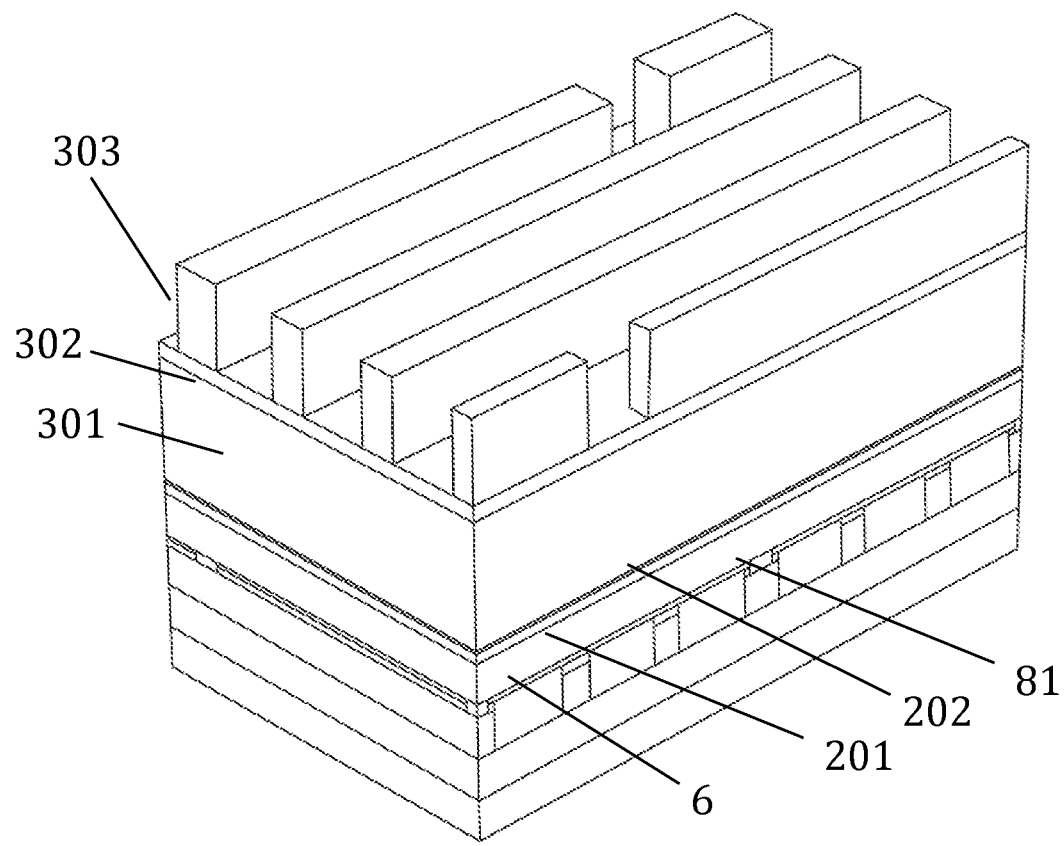

Reference is made to FIG. 11. In order to form a second entity, in this example, a stack, similar as that deposited on the substrate in FIG. 1, is deposited on the perforated surface, i.e., the top surface of the third dielectric material (6). For this, first, when (as in this example) not present (or not thick enough), a further superconductive material layer (201) is deposited, in physical contact with the vias (81). The superconductive material layer (201) preferably comprises the same superconductive material as the via (81) and the superconductive line structures (41). A layer of a fourth dielectric material (202), which may be the same as the first dielectric material, is deposited over, e.g., on, the further superconductive material layer (201). A patterning mask, in this example comprising an ashable hard mask (301), is formed over the layer of the fourth dielectric material (202). The patterning mask further comprises a silicon oxycarbide layer (302) covering the ashable hard mask (301). The patterning mask further comprises a patterned photoresist (303) overlying the silicon oxycarbide layer (32). The patterned photoresist (303) comprises line structures that are for forming a second set of line structures, comprising a second set of superconductive line structures, formed of the further superconductive material layer (201), and a second set of line structures made of the fourth dielectric material (202). Herein, the line structures of the patterned photoresist (303) are oriented such that the second set of line structures are oriented at an angle, e.g., perpendicular, with respect to the first set of line structures. Similar steps as described above for forming the first entity may be used for forming the second entity.

It is to be understood that although preferred embodiments, specific constructions and configurations, as well as materials, have been discussed herein for devices according to the present invention, various changes or modifications in form and detail may be made without departing from the scope of this invention. Steps may be added or deleted to methods described within the scope of the present invention.

The invention claimed is:

1. A method for forming a superconducting interconnect structure of an integrated circuit, comprising:
    a. forming a first entity on a substrate by:
        a1. providing a substrate,
        a2. forming a first superconductive layer of a first superconductive material having a first critical temperature on the substrate,
        a3. forming a layer of a first dielectric material over the first superconductive layer,
        a4. removing parts of the layer of the first dielectric material and of the first superconductive layer, said parts extending from a bottom surface of the first superconductive layer to a top surface of the first dielectric material, so as to form a pattern comprising a first set of line structures having a top surface, comprising:
    a first set of superconductive line structures, and
    a first set of line structures made of the first dielectric material, aligned with and overlying the first set of superconductive line structures, and comprising the top surface,
        a5. forming a second dielectric material, different from the first dielectric material, over and between the line structures of the first set,
        a6. planarizing the second dielectric material so that a top surface of the second dielectric material is coplanar with the top surface of the first set of line structures, and thereafter
        a7. forming a layer formed of a third dielectric material over the first set of line structures and the second dielectric material,
    thereby forming the first entity,
    b. providing a patterned mask over the first entity, the pattern comprising at least one opening overlapping with an underlying superconductive line structure of the first set of superconductive line structures for forming at least one via hole in the first dielectric material and the layer formed of the third dielectric material,
    c. transferring the pattern of the patterned mask into the first dielectric material and into the layer formed of the third dielectric material, so as to form the at least one via hole extending through the first dielectric material and the layer formed of the third dielectric material, thereby exposing part of the underlying superconductive line structure,
    d. removing the patterned mask, thereby exposing a perforated surface, and
    e. forming a superconductive unit made of one or more superconductive materials, each having a critical temperature within 1K of the first critical temperature, over the perforated surface thereby also forming at least one via by filling the at least one via hole, the at least one via extending through the first dielectric material and the layer formed of the third dielectric material, such that the formed superconductive unit physically contacts the underlying first set of superconductive line structures.

2. The method according to claim 1, further comprising, after step a7., and before step b.:
    a7'.: forming a hard mask layer over the first set of line structures, the second dielectric material, and the third dielectric material,
    wherein, in step b., the patterned mask is provided over the hard mask layer,
    wherein, in a step b1., after step b. and before step c., the pattern of the patterned mask is transferred into the hard mask layer, wherein, in step c., transferring the pattern of the patterned mask into the first dielectric material and into the layer formed of the third dielectric material, comprises transferring said pattern from the patterned hard mask layer into the layer formed of the third dielectric material and into the first dielectric material, and wherein step d. further comprises removing the patterned hard mask layer.

3. The method according to claim 1, comprising providing, after step e., a second entity over the superconductive unit, comprising the steps of:
 f. forming a layer of a fourth dielectric material over the superconductive unit,
 g. removing parts of the layer of the fourth dielectric material and of the superconductive unit so as to form a pattern comprising a second set of line structures, comprising:
  a second set of superconductive line structures, and
  a second set of line structures made of the fourth dielectric material, aligned with and overlying the second set of superconductive line structures, thereby providing the second entity over the first entity.

4. The method according to claim 3, wherein step e. consists of depositing a second superconductive layer made of a single second superconductive material having a critical temperature within 1K of the first critical temperature over the perforated surface so as to fill the at least one via hole extending through the first dielectric material and the layer formed of the third dielectric material and such that the deposited second superconductive layer physically contacts the underlying first set of superconductive line structures, and wherein step f. is performed directly after step e.

5. The method according to claim 1, wherein step e. comprises:
 e1. Forming a first part of the superconductive unit by depositing a second superconductive layer, made of a single superconductive material having a critical temperature within 1K of the first critical temperature, over the perforated surface so as to form at least one via by filling the at least one via hole, the at least one via extending through the first dielectric material, and extending through the layer formed of the third dielectric material, such that the formed second superconductive layer physically contacts the underlying first set of superconductive line structures,
 e2. planarizing the deposited second superconductive layer so as to remove a top portion of the second superconductive layer without removing the at least one via, and
 e3. Forming a second part of the superconductive unit by depositing a third superconductive layer, made of a single third superconductive material having a critical temperature within 1K of the first critical temperature, on the planarized second superconductive layer.

6. The method according to claim 5, wherein step e2. comprises using chemical mechanical polishing and/or etching.

7. The method according to claim 1, wherein the materials forming the first set of superconductive line structures and the superconductive unit are independently selected from MoN, $Nb_3Sn$, NbTi, Nb, NbTiN and NbN.

8. The method according to claim 1, wherein the at least one via hole in the first dielectric material and in the layer formed of the third dielectric material, has an aspect ratio of at most 0.5.

9. The method according to claim 1, comprising the following steps after step a. and before step b., or after step e. and before step f., when present:
 h. providing a third patterned mask over the first entity, the pattern comprising at least one further opening overlapping with an underlying superconductive line structure of the first set of superconductive line structures for forming at least one further via hole in the first dielectric material and the layer formed of the third dielectric material,
 i. transferring the pattern of the third patterned mask into the first dielectric material and the layer formed of the third dielectric material, so as to form at least one further via hole extending through the first dielectric material and the layer formed of the third dielectric material exposing part of the underlying superconductive line structure,
 j. removing the third patterned mask so as to expose a second perforated surface, and
 k. depositing a resistive material, the resistive material having a resistivity of at least 100 $\mu\Omega\cdot$cm at a temperature of 1K, over the second perforated surface so as to fill the at least one further via hole extending through the first dielectric material and the layer formed of the third dielectric material and such that the deposited resistive material contacts physically the underlying superconductive line structure.

10. The method according to claim 9, wherein said resistive material consists of the same chemical elements as the superconductive line structures, wherein a chemical composition of the resistive material is different from a chemical composition of the first superconductive material.

11. The method according to claim 1, wherein the first dielectric material is silicon nitride and wherein the second dielectric material is silicon oxide.

12. The method according to claim 1, wherein step e. comprises a step of depositing the superconductive material layer by physical vapor deposition.

13. The method according to claim 12, wherein step a2. is performed by physical vapor deposition.

14. A superconducting interconnect structure formable by the method according to claim 1, the interconnect structure comprising a first entity comprising:
 i. a first set of line structures having a top surface, comprising:
  a first set of superconductive line structures,
  a first set of lines structures made of a first dielectric material, aligned with and overlying the first set of superconductive line structures, and comprising the top surface, and
 ii. a second dielectric material, different from the first dielectric material, between the line structures of the first set having a top surface coplanar with the top surface of the first set of line structures, and
 iii. a third dielectric material overlying the first set of line structures and the second dielectric material,
 and wherein a via extends through the first dielectric material and the layer formed of the third dielectric material, wherein the via comprises a superconducting material physically contacting the underlying superconductive line structure.

15. The superconducting interconnect structure according to claim 14, wherein the at least one via in the first dielectric material and in the layer formed of the third dielectric material, has an aspect ratio of at most 0.5.

* * * * *